United States Patent
Yin et al.

(10) Patent No.: US 9,473,120 B1
(45) Date of Patent: Oct. 18, 2016

(54) HIGH-SPEED AC-COUPLED INVERTER-BASED BUFFER WITH REPLICA BIASING

(71) Applicant: QUALCOMM Incorporated, San Diego, CA (US)

(72) Inventors: Wenjing Yin, San Diego, CA (US); Jeffrey Mark Hinrichs, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 14/714,954

(22) Filed: May 18, 2015

(51) Int. Cl.
  *H03B 1/00* (2006.01)
  *H03K 3/00* (2006.01)
  *H03K 3/356* (2006.01)

(52) U.S. Cl.
  CPC ............................. *H03K 3/356104* (2013.01)

(58) Field of Classification Search
  USPC .............. 327/2–12, 105–123, 141, 144–163; 331/1 A, 15–17; 375/373–376
  See application file for complete search history.

(56) References Cited

U.S. PATENT DOCUMENTS

| | | | |
|---|---|---|---|
| 6,445,253 B1 | 9/2002 | Talbot | |
| 7,183,817 B2 | 2/2007 | Sanchez et al. | |
| 7,719,313 B2 * | 5/2010 | Narathong | H03K 3/356017 326/83 |
| 8,242,854 B2 * | 8/2012 | Mishra | H03L 7/099 326/27 |
| 8,415,991 B2 * | 4/2013 | Rangarajan | H03K 17/6872 327/108 |
| 2007/0001716 A1 * | 1/2007 | Sanchez | H03K 19/018585 327/112 |
| 2008/0042770 A1 | 2/2008 | Berens | |
| 2008/0266002 A1 | 10/2008 | Liu et al. | |
| 2010/0188156 A1 * | 7/2010 | Arai | H03L 3/00 331/15 |
| 2014/0018028 A1 * | 1/2014 | Lemkin | H03D 7/1441 455/269 |
| 2014/0028397 A1 | 1/2014 | Dhanasekaran | |
| 2014/0111252 A1 | 4/2014 | Zhuo et al. | |
| 2014/0167860 A1 | 6/2014 | Dhanasekaran | |
| 2014/0253210 A1 | 9/2014 | Rajaee et al. | |
| 2014/0256276 A1 | 9/2014 | Li et al. | |
| 2014/0375363 A1 * | 12/2014 | Chen | H03L 7/18 327/115 |

OTHER PUBLICATIONS

Partial International Search Report—PCT/US2016/027813—ISA/EPO—Jun. 28, 2016.

* cited by examiner

*Primary Examiner* — Brandon S Cole
(74) *Attorney, Agent, or Firm* — Patterson & Sheridan, L.L.P.

(57) ABSTRACT

Certain aspects of the present disclosure provide a high-speed AC-coupled inverter-based buffer, which may be used as a buffer for a voltage-controlled oscillator (VCO), for example. One example buffer for a VCO generally includes a first inverter stage having an input node configured to receive a first complementary signal of a differential pair, a second inverter stage having an input node configured to receive a second complementary signal of the differential pair, a biasing stage replicating the first inverter stage or the second inverter stage, wherein an output node of the biasing stage is connected with an input node of the biasing stage, a first impedance coupled between the input node of the first inverter stage and the input node of the biasing stage, and a second impedance coupled between the input node of the second inverter stage and the input node of the biasing stage.

28 Claims, 7 Drawing Sheets

HIGH-SPEED AC-COUPLED INVERTER-BASED BUFFER WITH REPLICA BIASING

TECHNICAL FIELD

Certain aspects of the present disclosure generally relate to electronic circuits and, more particularly, to a high-speed AC-coupled inverter-based buffer with replica biasing.

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a wireless local area network (WLAN) in accordance with the Institute of Electrical and Electronics Engineers (IEEE) 802.11 standard (e.g., Wi-Fi) or a wireless personal area network (WPAN) in accordance with the IEEE 802.15 standard. Another example wireless network may be a 3G (the third generation of mobile phone standards and technology), 4G, or later generation system, which may provide network service via any one of various radio access technologies (RATs) including EVDO (Evolution-Data Optimized), 1×RTT (1 times Radio Transmission Technology, or simply 1×), W-CDMA (Wideband Code Division Multiple Access), UMTS-TDD (Universal Mobile Telecommunications System-Time Division Duplexing), HSPA (High Speed Packet Access), GPRS (General Packet Radio Service), or EDGE (Enhanced Data rates for Global Evolution). The 3G network is a wide area cellular telephone network that evolved to incorporate high-speed internet access and video telephony, in addition to voice calls. Furthermore, a 3G network may be more established and provide larger coverage areas than other network systems. Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, 3$^{rd}$ Generation Partnership Project (3GPP) Long Term Evolution (LTE) networks, and Long Term Evolution Advanced (LTE-A) networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

SUMMARY

Certain aspects of the present disclosure generally relate to an AC-coupled inverter-based buffer with a replica biasing stage, which may be used as a high-speed voltage-controlled oscillator (VCO) buffer.

Certain aspects of the present disclosure provide a buffer for a voltage-controlled oscillator (VCO). The buffer generally includes a first inverter stage having an input node configured to receive a first complementary signal of a differential pair; a second inverter stage having an input node configured to receive a second complementary signal of the differential pair; a biasing stage replicating the first inverter stage or the second inverter stage, wherein an output node of the biasing stage is connected with an input node of the biasing stage; a first impedance coupled between the input node of the first inverter stage and the input node of the biasing stage; and a second impedance coupled between the input node of the second inverter stage and the input node of the biasing stage.

According to certain aspects, the buffer further includes a cross-coupled transistor stage coupled to the first inverter stage and the second inverter stage. The cross-coupled transistor stage is configured to generate an output signal of the buffer. For certain aspects, the buffer further includes a third inverter stage coupled between the first inverter stage and the cross-coupled transistor stage and a fourth inverter stage coupled between the second inverter stage and the cross-coupled transistor stage.

According to certain aspects, the buffer further includes a first capacitive element coupled to the input node of the first inverter stage and a second capacitive element coupled to the input node of the second inverter stage such that the differential pair is an AC-coupled differential signal.

According to certain aspects, a first resistive element is lacking between the input node of the first inverter stage and an output node of the first inverter stage, and a second resistive element is lacking between the input node of the second inverter stage and an output node of the second inverter stage.

According to certain aspects, the differential pair oscillates with a frequency of at least 8 GHz.

According to certain aspects, the biasing stage is configured to shift a DC offset of the differential pair to a level midway between two power supply rails for the buffer, and the two power supply rails are configured to power the first and second inverter stages.

According to certain aspects, a duty cycle of a periodic signal at an output of the buffer is between 45% and 55% when the differential pair oscillates with a frequency of 10 GHz across process, voltage, and temperature variations.

According to certain aspects, P-type metal-oxide-semiconductor (PMOS) and N-type metal-oxide-semiconductor (NMOS) transistors of the biasing stage have the same sizes as PMOS and NMOS transistors of the first inverter stage or the second inverter stage.

According to certain aspects, a voltage at the output node of the biasing stage is configured to track at least one of temperature drift or one or more process variations of a threshold voltage for transistors in the first inverter stage or the second inverter stage.

According to certain aspects, the biasing stage comprises a P-type metal-oxide-semiconductor (PMOS) transistor and an N-type metal-oxide-semiconductor (NMOS) transistor. In this case, a drain of the PMOS transistor may be connected with a drain of the NMOS transistor to form the output node of the biasing stage, a gate of the PMOS transistor may be connected with a gate of the NMOS transistor to form the input node of the biasing stage; and the input and output nodes of the biasing stage may be shorted together.

According to certain aspects, the first and second impedances comprise two resistive elements having equal resistance.

According to certain aspects, the first inverter stage matches the second inverter stage. For example, the first inverter stage may have the same components and topology as the second inverter stage.

Certain aspects of the present disclosure provide a method of buffering differential signals using a buffer. The method generally includes receiving a first complementary signal of a differential pair via an input node of a first inverter stage of the buffer; receiving a second complementary signal of the differential pair via an input node of a second inverter stage of the buffer; shifting an offset voltage of the differential pair using a biasing stage replicating the first inverter stage or the second inverter stage, wherein an output node of the biasing stage is connected with an input node of the biasing stage; and generating an output signal of the buffer based on the differential pair and the shifted offset voltage.

Certain aspects of the present disclosure provide an apparatus for buffering differential signals. The apparatus generally includes means for inverting a first complementary signal of a differential pair; means for inverting a second complementary signal of the differential pair; means for shifting an offset voltage of the differential pair using a biasing stage replicating the means for inverting the first complementary signal or the means for inverting the second complementary signal, wherein an output node of the biasing stage is connected with an input node of the biasing stage; and means for generating an output signal of the apparatus based on the differential pair and the shifted offset voltage.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Certain aspects of the present disclosure provide an inverter-based buffer, which may be used for buffering an output of a voltage-controlled oscillator (VCO). The buffer presented herein may be coupled to the output of the VCO to isolate the VCO from a heavy load. In this case, the buffer may be configured to amplify the VCO's output swing rail-to-rail and to correct, or at least adjust, the VCO output's duty cycle. A replica biasing stage may be used to level shift the VCO output's DC offset to mid-rail (between the positive and negative supply rails providing power to the buffer) and match the threshold voltage of an inverter stage in the buffer.

Various aspects of the present disclosure are described below. It should be apparent that the teachings herein may be embodied in a wide variety of forms and that any specific structure, function, or both being disclosed herein is merely representative. Based on the teachings herein, one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. Furthermore, an aspect may comprise at least one element of a claim.

The word "exemplary" is used herein to mean "serving as an example, instance, or illustration." Any aspect described herein as "exemplary" is not necessarily to be construed as preferred or advantageous over other aspects.

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement Global System for Mobile Communications (GSM) or some other standards. These various standards are known in the art.

An Example Wireless System

Figure 1:
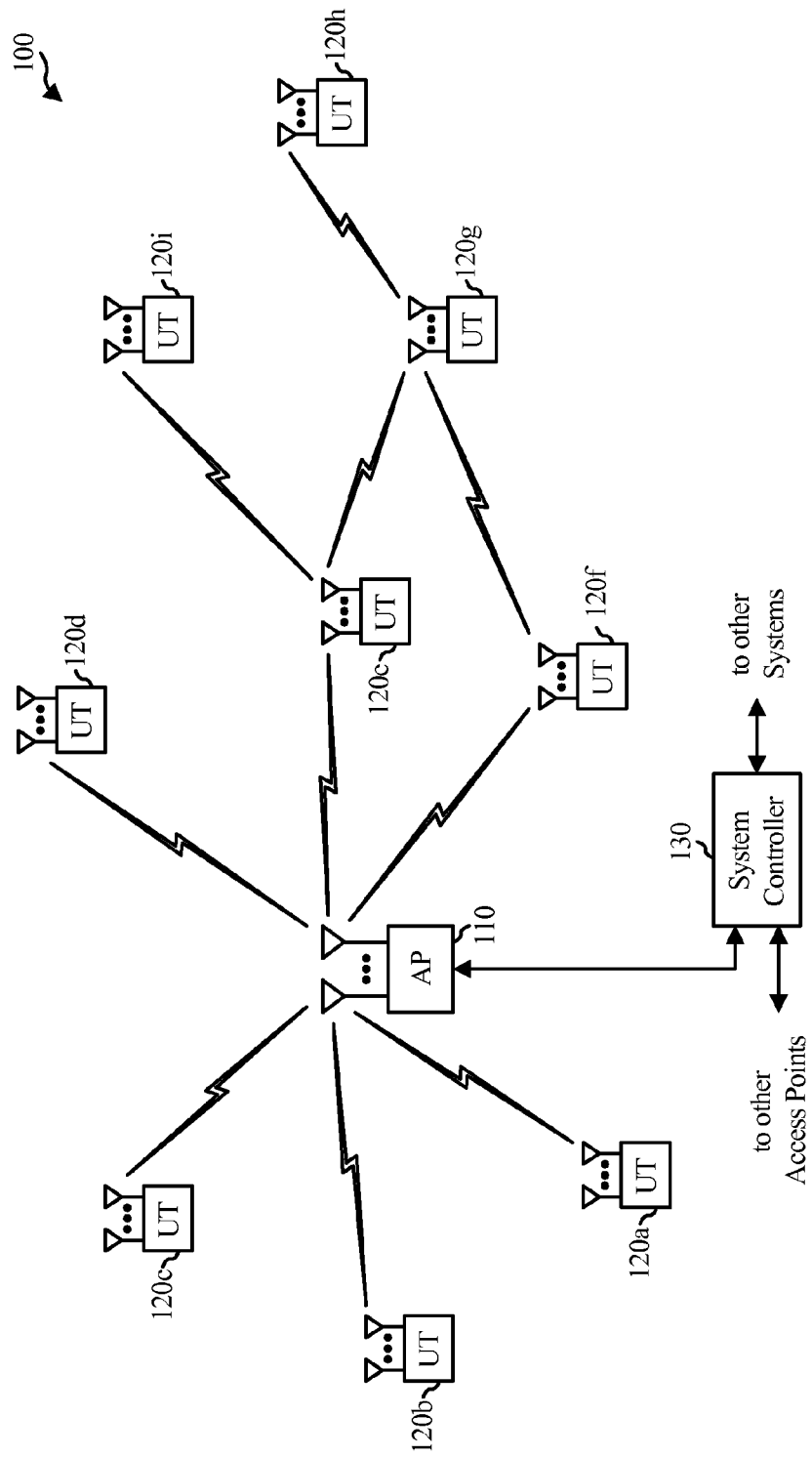
FIG. 1 is a diagram of an example wireless communications network, in accordance with certain aspects of the present disclosure.

FIG. 1 illustrates a wireless communications system 100 with access points 110 and user terminals 120, either of which may include or utilize aspects of the present disclosure. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc. In certain aspects of the present disclosure, the AP and/or UT may comprise a transceiver front-end having a phase-locked loop (PLL) with a voltage-controlled oscillator (VCO). The AP and/or UT may further comprise a buffer configured to buffer an oscillating signal generated by the VCO, as described below.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink may share the same frequency band. For an FDD system, the downlink and uplink use different frequency bands. System 100 may also utilize a single carrier or multiple carriers for transmission. Each user terminal may be equipped with a single antenna (e.g., in order to keep costs down) or multiple antennas (e.g., where the additional cost can be supported).

Figure 2:
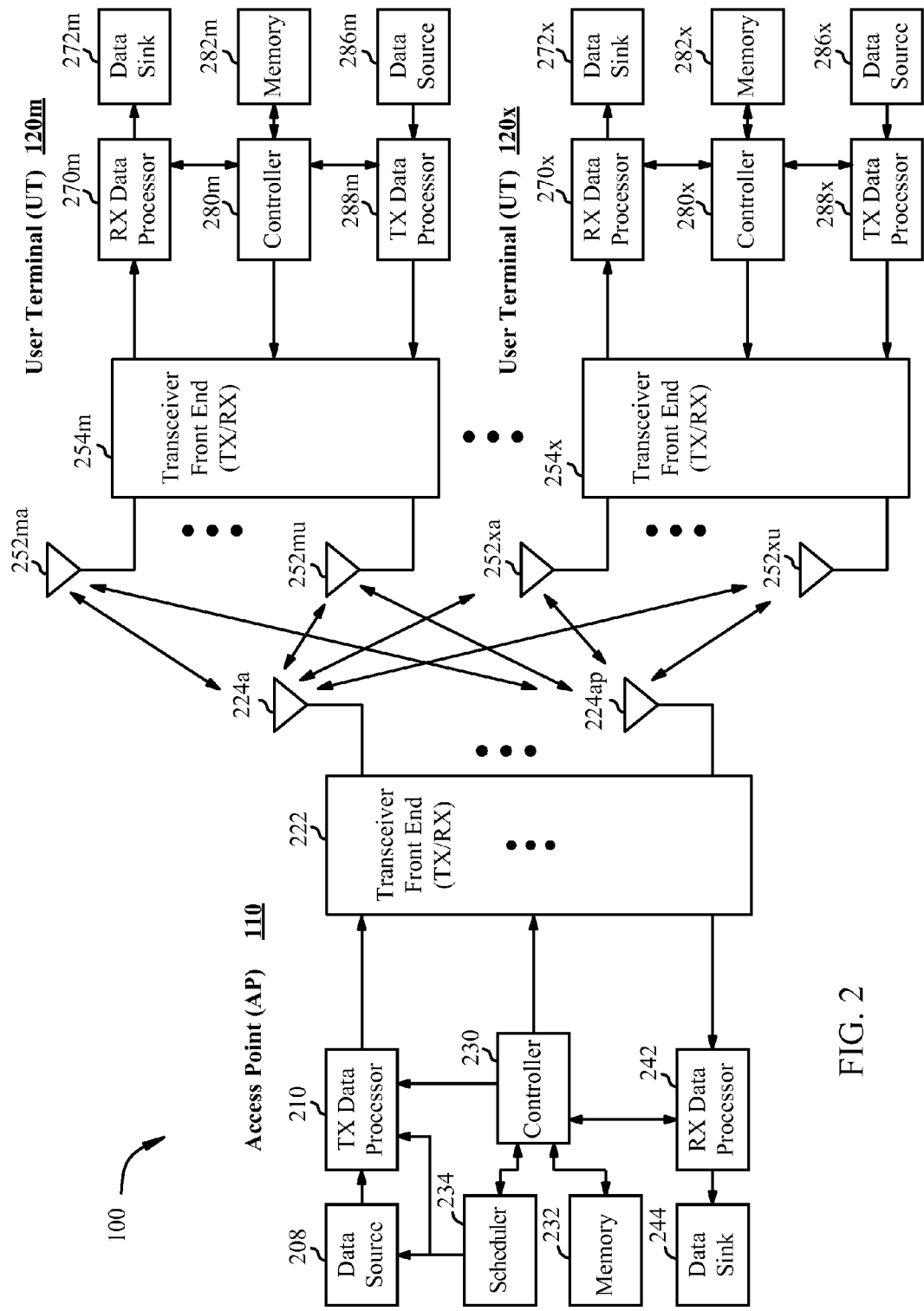
FIG. 2 is a block diagram of an example access point (AP) and example user terminals, in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. For certain aspects of the present disclosure, a combination of the signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing. In certain aspects of the present disclosure, either or both transceiver front ends 222 and 254 may comprise a VCO and a VCO buffer. The VCO buffer may be configured to buffer an oscillating signal generated by the VCO, as described below.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. For certain aspects of the present disclosure, a combination of the signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof.

An Example Transceiver Front End

Figure 3:
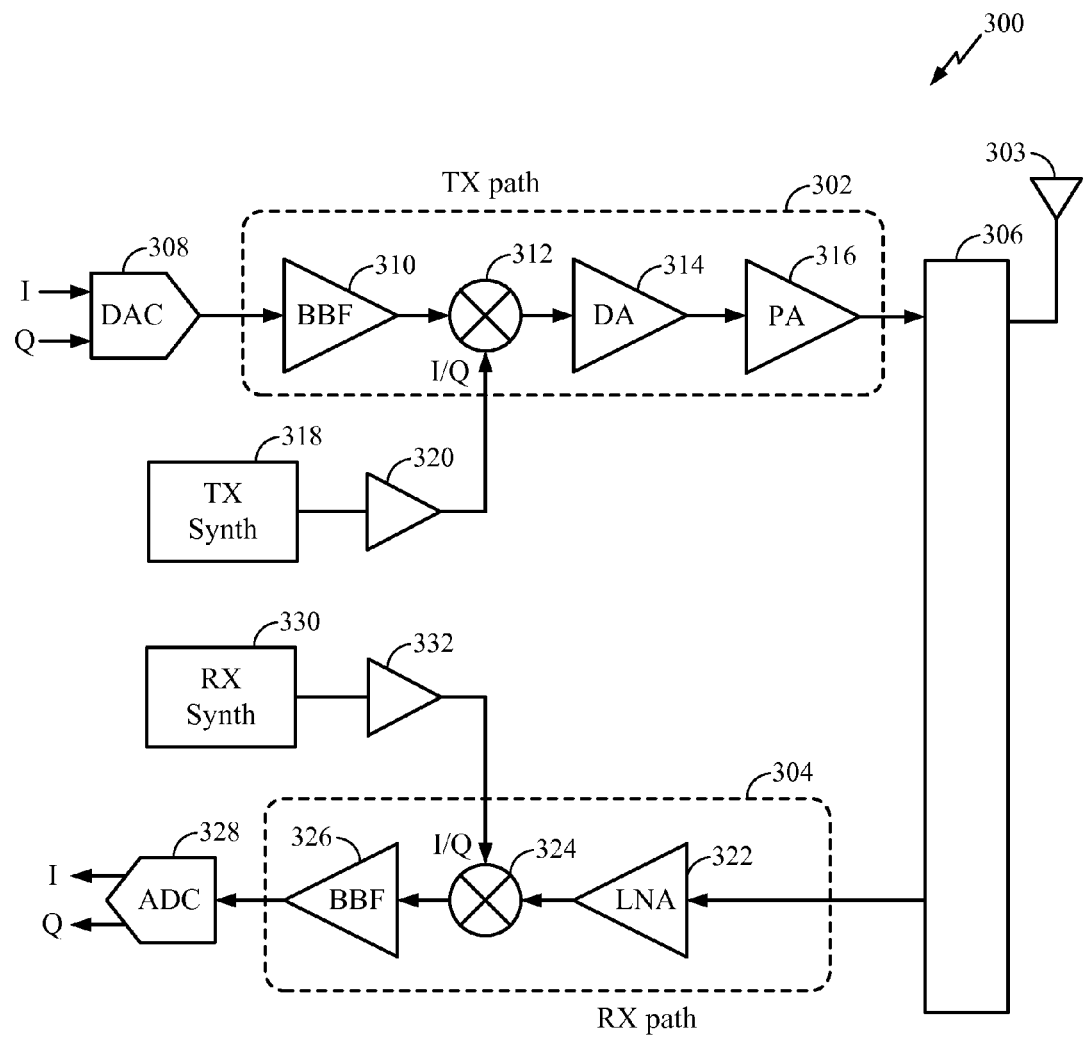
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be implemented. The transceiver front end 300 includes at least one transmit (TX) path 302 (also known as a transmit chain) for transmitting signals via one or more antennas and at least one receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 is often external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which are amplified by the DA 314 and by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in an RFIC, which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning to different frequencies indicates using a variable-frequency oscillator, which involves compromises between stability and tunability. Contemporary systems employ frequency synthesizers with a voltage-controlled oscillator (VCO) to generate a stable, tunable LO with a particular tuning range. Thus, the transmit LO is typically produced by a TX frequency synthesizer 318, which may be buffered or amplified by amplifier 320 before being mixed with the baseband signals in the mixer 312. Similarly, the receive LO is typically produced by an RX frequency synthesizer 330, which may be buffered or amplified by amplifier 332 before being mixed with the RF signals in the mixer 324. In some aspects of the present disclosure, the VCO may be implemented as a part of a phase-locked loop (PLL) circuit.

Example Phase-Locked Loop

Figure 4:
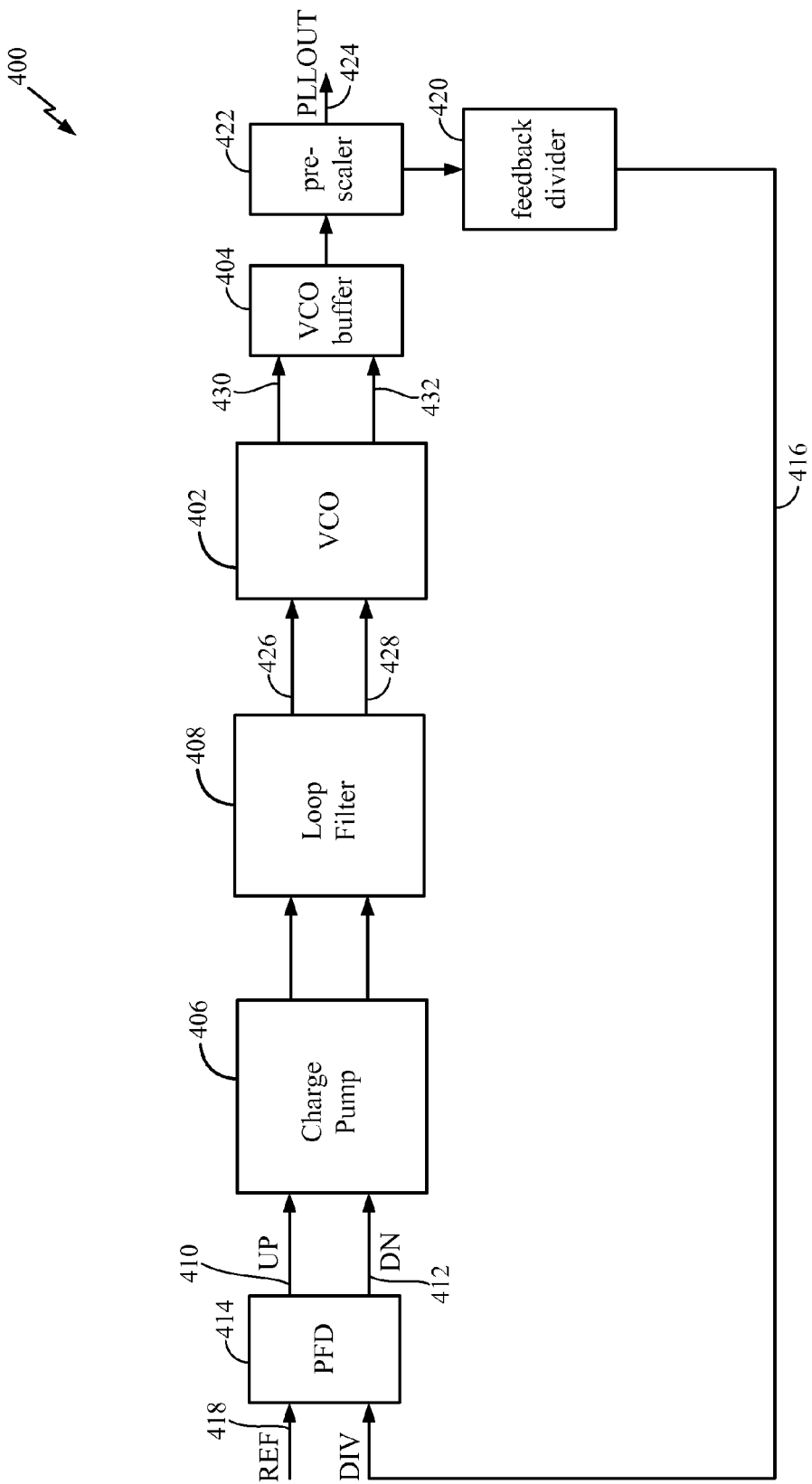
FIG. 4 is a block diagram of an example phase-locked loop (PLL) with a voltage-controlled oscillator (VCO) connected to a VCO buffer, in accordance with certain aspects of the present disclosure.

FIG. 4 is a block diagram of an example phase-locked loop (PLL) 400 comprising a VCO 402 interfaced with a VCO buffer 404, in accordance with certain aspects of the present disclosure. The PLL 400 may be utilized in a frequency synthesizer, such as the TX frequency synthesizer 318 or the RX frequency synthesizer 330 of FIG. 3.

As illustrated in FIG. 4, a charge pump 406 coupled to a low-pass loop filter 408 may provide a control voltage to the VCO 402 that determines an oscillation frequency of the VCO 402. The charge pump 406 and the VCO 402 may receive power via two power supply rails, a positive supply rail and a negative supply rail. Switches in the charge pump 406 may be controlled by up/down pulse signals 410, 412, and the loop filter 408 may reject the high frequency transient signals from this switching activity. These up/down pulse signals 410, 412 may be generated by a phase frequency detector (PFD) 414, which may compare a feedback signal 416 (based on an output or processed output of the VCO 402 and labeled "DIV") to a reference frequency signal 418 (labeled "REF"). In an aspect, as illustrated in FIG. 4, the feedback signal 416 may be generated by buffering the output of the VCO 402 with the VCO buffer 404, scaling the buffered signal in a pre-scaler 422 to generate the PLL's output signal 424 (labeled "PLLOUT"), and dividing an output of the pre-scaler 422 in a feedback divider 420.

In some aspects of the present disclosure, as illustrated in FIG. 4, the input control voltage for the VCO 402 may be provided by the charge pump 406 and the low-pass loop filter 408 via VCO control inputs 426, 428. A resonant tank circuit of the VCO 402 may generate, at differential VCO outputs 430, 432, a periodic signal having a specific frequency (e.g., determined by a voltage at the VCO control inputs 426, 428), which may be input to the VCO buffer 404. The VCO buffer 404 may be coupled to the differential VCO outputs 430, 432 in an effort to isolate the VCO 402 from the load in the PLL 400 and other circuits receiving the PLL's output signal 424. The VCO buffer 404 may be also employed in an effort to amplify the signal swing and correct any duty cycle distortions of the differential VCO outputs 430, 432.

Example Inverter-Based Buffer with Replica Biasing Stage

Figure 5:
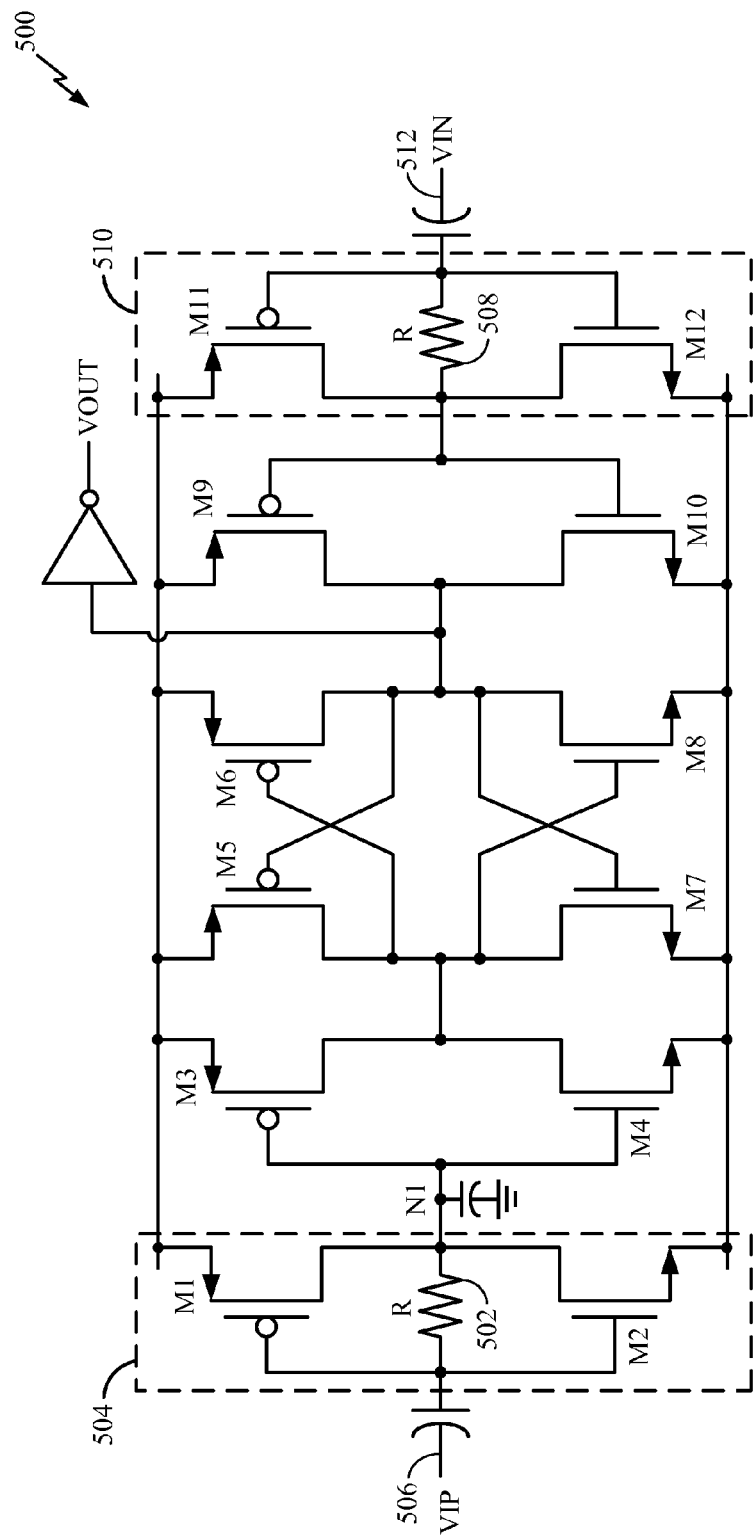
FIG. 5 is a schematic diagram of an example prior art AC-coupled inverter-based buffer.

FIG. 5 illustrates a conventional example implementation of a buffer 500 configured to interface with differential outputs (e.g., outputs 430, 432 of VCO 402) and suitable for use as a VCO buffer 404 for some VCOs. For the buffer 500 illustrated in FIG. 5, a feedback resistor 502 may be disposed across a first inverter stage 504 to level shift a positive input signal 506 ($V_{IP}$) of a differential pair (e.g., the first differential output 430 from the VCO 402). The first inverter stage 504 may be a complementary metal-oxide semiconductor (CMOS) inverter stage composed of a p-channel MOS (PMOS) transistor M1 and an n-channel MOS (NMOS) transistor M2. In addition, a feedback resistor 508 may be located across a second inverter stage 510 to level shift a negative input signal 512 ($V_{IN}$) of the differential pair (e.g., the second differential output 432 from the VCO 402, complementary to the first output). The second inverter stage 510 may be a CMOS inverter stage composed of a PMOS transistor M11 and an NMOS transistor M12. However, the feedback resistors 502, 508 may increase routing parasitics (and lower the cutoff frequency of the low-pass filter created in conjunction with the parasitic capacitance at node N1, for example) and, thus, may filter out high-speed signals. Also, the limited resistance of the feedback resistors 502, 508 may decrease gains of the first and second inverter stages 504, 510. Hence, the buffer 500 may not be suitable for processing ultra-high-speed periodic signals (e.g., clock signals), such as those generated by some VCOs.

Alternative approaches to implementing a high-speed buffer based on current-mode logic (CML) can process an ultra-high-speed periodic signal. However, the CML-based buffer may consume significantly higher electrical current compared to an inverter-based buffer (e.g., the buffer 500 of FIG. 5), which may be problematic for battery-operated devices, such as cellular phones, smartphones, tablets, laptops, and the like.

Accordingly, techniques and circuits are needed to implement a buffer capable of accurately processing an ultra-high-speed periodic signal with lowered power consumption compared to CML-based buffers.

Certain aspects of the present disclosure provide an inverter-based buffer capable of buffering an ultra-high-speed and low-amplitude clock signal, in which the feedback resistors (e.g., resistors 502, 508) have been removed, thereby increasing the gain of the inverter stages and reducing parasitic capacitance at the output of the inverter stages. This buffer uses a biasing stage that replicates one of the inverter stages and level shifts the offset voltage of the differential input signals to mid-rail (e.g., midway between the power supply rails powering the inverter stages). Because this replica biasing stage may copy one of the inverter stages as far as topology and transistor sizes are concerned, the biasing stage may also track variations due to process, voltage, and temperature (PVT), helping to achieve more accurate duty cycle for a high-speed periodic signal output by the buffer. This buffer may be used as a VCO buffer to isolate the VCO output from a heavy load and is capable of amplifying the VCO's output swing rail-to-rail.

Figure 6:
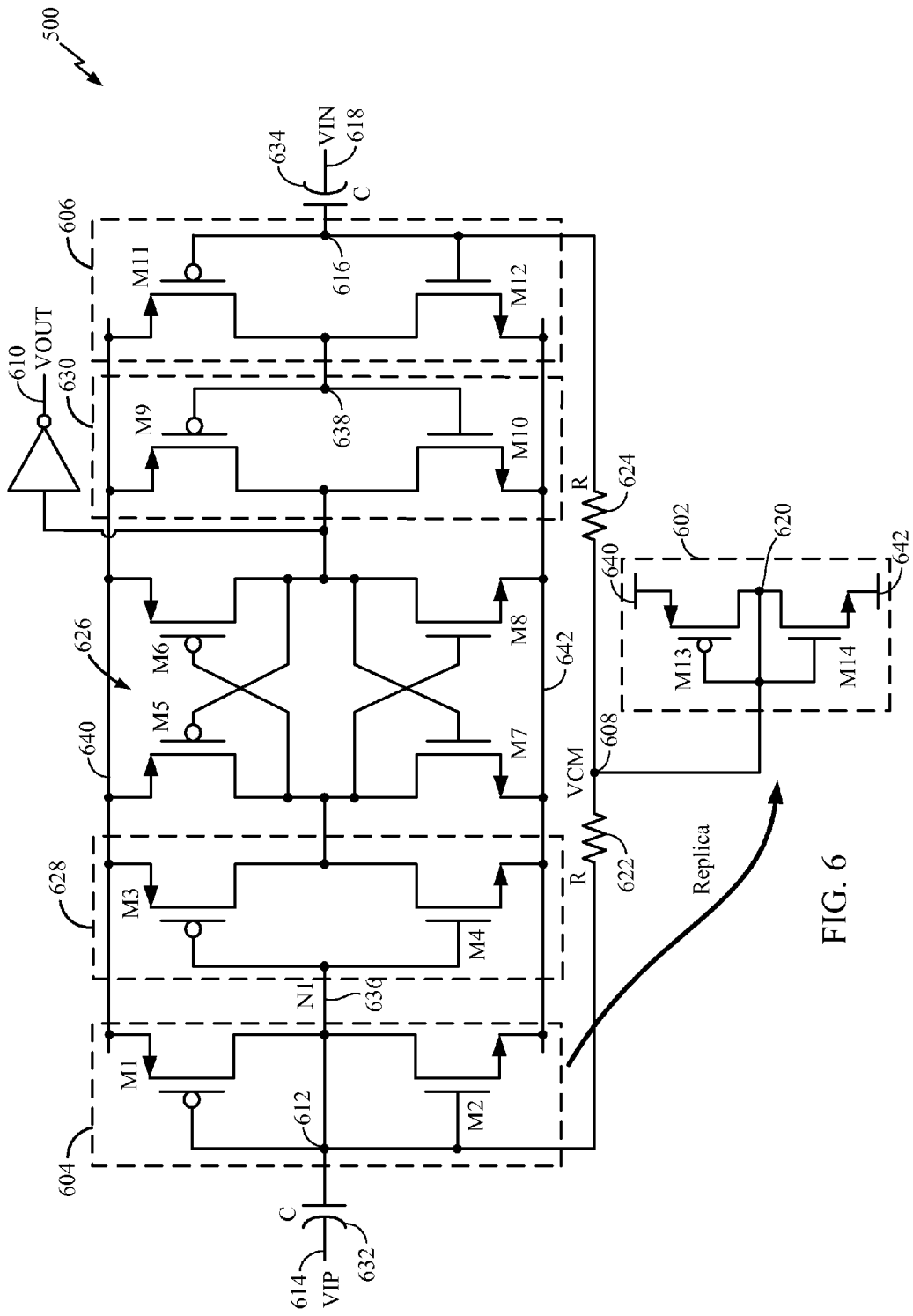
FIG. 6 is a schematic diagram of an example AC-coupled inverter-based buffer with a replica biasing stage, in accordance with certain aspects of the present disclosure.

FIG. 6 illustrates an example AC-coupled inverter-based buffer 600 with a replica biasing stage 602, in accordance with certain aspects of the present disclosure. The buffer 600 may be suitable for use as a VCO buffer 404 and may be capable of processing ultra-high-speed signals, such as signals having a frequency of at least 8 GHz.

Similar to the buffer 500 in FIG. 5, the buffer 600 may be configured to receive differential output signals (e.g., outputs 430, 432 of VCO 402) from a circuit coupled to the buffer as differential input signals to the buffer. For example, a first inverter stage 604 of the buffer 600 may be configured to receive a positive input signal 614 ($V_{IP}$) of a differential pair (e.g., the first differential output 430 from the VCO 402), and a second inverter stage 606 may be configured to receive a negative input signal 618 ($V_{IN}$) of the differential pair (e.g., the second differential output 432 from the VCO 402, complementary to the first output). The first and second inverter stages 604, 606 may be copies of one another, having the same topology, layout, transistor sizes, and the like. The first inverter stage 604 may be a CMOS inverter stage composed of a PMOS transistor M1 and an NMOS transistor M2. Likewise, the second inverter stage 606 may be a CMOS inverter stage composed of a PMOS transistor M11 and an NMOS transistor M12.

For certain aspects as illustrated in FIG. 6, the input signals ($V_{IP}$ and $V_{IN}$) to the buffer 600 may be AC-coupled via series capacitors 632, 634 before being input to the input nodes 612, 616 of the first and second inverter stages 604, 606, respectively. This type of buffer may be referred to as an AC-coupled inverter-based buffer.

The replica biasing stage 602 may replicate the first inverter stage 604 and/or the second inverter stage 606. In other words, the replica biasing stage 602 may use the same topology and the same device sizes (e.g., the same sizes of transistors) as the first inverter stage 604 and/or the second inverter stage 606. For example, the replica biasing stage 602 may also be a CMOS inverter stage composed of a PMOS transistor M13 and an NMOS transistor M14. An output node 620 of the biasing stage 602 may be connected with an input node (e.g., the common-mode voltage ($V_{CM}$) node 608) of the biasing stage. A drain of the PMOS transistor M13 may be coupled to a drain of the NMOS transistor M14 to form the output node 620 of the biasing stage 602. A gate of the PMOS transistor M13 may be connected with a gate of the NMOS transistor M14 to form the input node of the biasing stage 602. For certain aspects, the input and output nodes 608, 620 of the biasing stage 602 may be shorted together.

As illustrated in FIG. 6, an impedance (e.g., provided by a resistor 622) may be coupled between the input node 612 of the first inverter stage 604 and the input node of the biasing stage 602. Furthermore, an impedance (e.g., provided by a resistor 624) may be coupled between the input node 616 of the second inverter stage 606 and the input node of the biasing stage 602. The resistors 622, 624 may have equal resistance R.

The replica biasing stage 602 may be configured to level shift a DC offset of the differential input signals 614, 618 to a level midway between two power supply rails (e.g., positive power supply rail 640 and negative power supply rail 642) for the buffer, or at least for the first and second inverter stages 604, 606. A biasing stage 602 replicating the first and/or second inverter stages 604, 606 may ensure that the common-mode voltage at the $V_{CM}$ node 608 tracks process variations of at least one of a threshold voltage of the first inverter stage 604 or of the second inverter stage 606. Therefore, more accurate duty cycle for high-speed periodic signals may be achieved at the output 610 ($V_{OUT}$) of the buffer 600. It can be also shown (e.g., based on Monte Carlo simulations) that the buffer 600 illustrated in FIG. 6 may maintain a duty cycle of a periodic output signal having a frequency of 10 GHz between 45% and 55% across process, voltage, and temperature (PVT) variations.

For certain aspects as illustrated in FIG. 6, a cross-coupled transistor stage 626 may be coupled to the first inverter stage 604 and the second inverter stage 606, and configured to generate the output 610 of the buffer 600. As illustrated in FIG. 6, a third inverter stage 628 may be coupled between the first inverter stage 604 and the cross-coupled transistor stage 626. The third inverter stage 628 may also be a CMOS inverter stage composed of a PMOS transistor M3 and an NMOS transistor M4, and the output node 636 of the first inverter stage 604 may be the input node for the third inverter stage 628. Further, a fourth inverter stage 630 may be coupled between the second inverter stage 606 and the cross-coupled transistor stage 626. The fourth inverter stage 630 may also be a CMOS inverter stage composed of a PMOS transistor M9 and an NMOS transistor M11, and the output node 638 of the second inverter stage 606 may be the input node for the fourth inverter stage 630. The output nodes of the third and fourth inverter stages may be the input nodes for the cross-coupled transistor stage 626. The cross-coupled transistor stage 626 may prevent the inverter stages 604, 606, 628, 630 from operating independently. The cross-coupled transistor stage may also be implemented with CMOS logic comprising PMOS transistors M5 and M6 and NMOS transistors M7 and M8. The gate of transistor M5 may be coupled to the drain of transistor M6, and the gate of transistor M6 may be coupled to the drain of transistor M5. Similarly, the gate of transistor M7 may be coupled to the drain of transistor M8, and the gate of transistor M8 may be coupled to the drain of transistor M7. The sources of transistors M5 and M6 may be coupled to the positive power supply rail 640, and the sources of transistors M7 and M8 may be coupled to the negative power supply rail 642. The drains of transistors M6 and M8 may be the output node for the cross-coupled transistor stage, which may be coupled to an inverter (e.g., another inverter stage) that produces the single-ended output 610 of the buffer 600.

Figure 7:
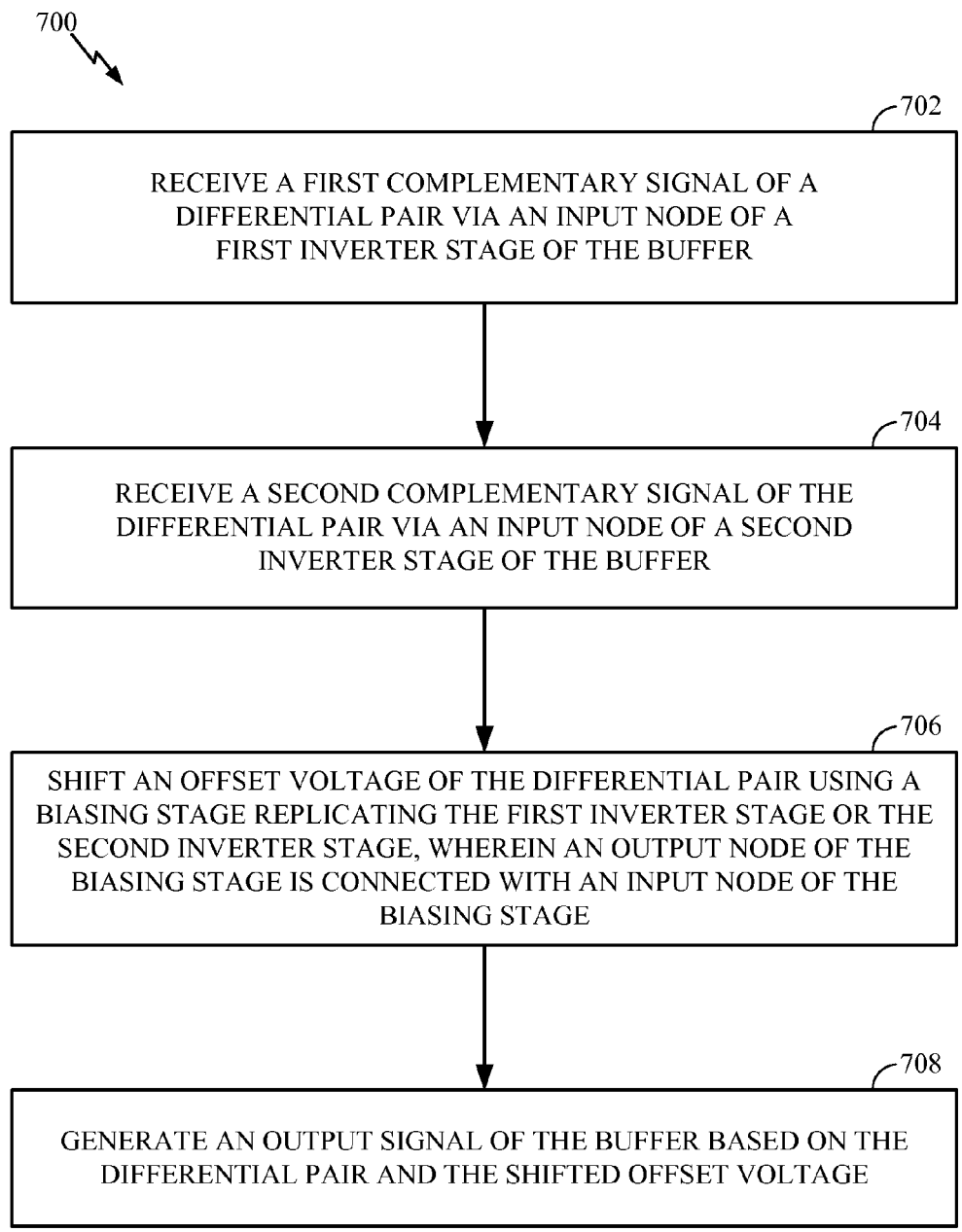
FIG. 7 is a flow diagram of example operations for using an inverter-based buffer with a replica biasing stage, in accordance with certain aspects of the present disclosure.

FIG. 7 is a flow diagram of example operations 700 for buffering differential signals using a buffer, in accordance with certain aspects of the present disclosure. The operations 700 may be performed, for example, by the buffer 600 illustrated in FIG. 6.

The operations 700 may begin, at block 702, with the buffer receiving a first complementary signal (e.g., the positive input signal 614) of a differential pair via an input node (e.g., the node 612) of a first inverter stage of the buffer (e.g., the first inverter stage 604). For certain aspects, the differential pair may oscillate with a frequency of at least 8 GHz. At block 704, the buffer may receive a second complementary signal (e.g., the negative input signal 618) of the differential pair via an input node (e.g., the node 616) of a second inverter stage of the buffer (e.g., the second inverter stage 606). For certain aspects, the first inverter stage has the same components and topology as the second inverter stage (as illustrated in FIG. 6).

At block 706, the buffer may shift an offset voltage of the differential pair using a biasing stage (e.g., the biasing stage 602) replicating the first inverter stage or the second inverter stage. An output node (e.g., the output node 620) of the biasing stage may be connected with an input node (e.g., the VCM node 608) of the biasing stage. According to certain aspects, the biasing stage includes P-type metal-oxide-semiconductor (PMOS) and N-type metal-oxide-semiconductor (NMOS) transistors having the same sizes as PMOS and NMOS transistors of the first inverter stage or the second inverter stage.

According to certain aspects, the biasing stage includes a PMOS transistor (e.g., PMOS transistor M13) and an NMOS transistor (e.g., NMOS transistor M14). A drain of the PMOS transistor may be connected with a drain of the NMOS transistor to form the output node of the biasing stage. A gate of the PMOS transistor may be connected with a gate of the NMOS transistor to form the input node of the biasing stage. For certain aspects, the input and output nodes of the biasing stage are shorted together.

At block 708, the buffer may generate an output signal (e.g., the output 610) of the buffer based on the differential pair and the offset voltage shifted at block 706. For certain aspects, generating the output signal includes using a cross-coupled transistor stage (e.g., the cross-coupled transistor stage 626) coupled to the first inverter stage and to the second inverter stage to generate the output signal. In this case, the buffer may further include a third inverter stage (e.g., the third inverter stage 628) coupled between the first inverter stage and the cross-coupled transistor stage and a fourth inverter stage (e.g., the fourth inverter stage 630) coupled between the second inverter stage and the cross-coupled transistor stage.

According to certain aspects, the operations further involve receiving power at the first inverter stage and the second inverter stage via two power supply rails (e.g., power supply rails 640, 642) for the buffer. In this case, the shifting at block 706 may entail shifting the offset voltage of the differential pair to a level midway between the two power supply rails.

According to certain aspects, the differential pair is an AC-coupled differential signal. In this case, the buffer may further include a first capacitive element (e.g., the capacitor 632) coupled to the input node of the first inverter stage. Furthermore, the buffer may also include a second capacitive element (e.g., the capacitor 634) coupled to the input node of the second inverter stage.

According to certain aspects, the buffer may be lacking a first resistive element (e.g., the resistor 502) coupled between the input node of the first inverter stage and an output node (e.g., the node 636) of the first inverter stage. Moreover, the buffer may also be lacking a second resistive element (e.g., the resistor 508) coupled between the input node of the second inverter stage and an output node (e.g., the output node 638) of the second inverter stage.

According to certain aspects, a voltage at the output node of the biasing stage is configured to track at least one of temperature drift or one or more process variations of a threshold voltage for transistors in the first inverter stage or the second inverter stage.

According to certain aspects, the buffer further includes a first impedance coupled between the input node (e.g., the input node 612) of the first inverter stage and the input node (e.g., the VCM node 608) of the biasing stage and a second impedance coupled between the input node (e.g., the input node 616) of the second inverter stage and the input node of the biasing stage. For certain aspects, the first and second impedances include two resistive elements (e.g., the resistors 622, 624) having equal resistance.

According to certain aspects, a duty cycle of the output signal of the buffer is between 45% and 55% when the differential pair oscillates with a frequency of 10 GHz across process, voltage, and temperature variations.

CONCLUSION

Certain aspects of the present disclosure provide a high-speed inverter-based buffer with replica biasing, suitable for use as a VCO buffer. The present disclosure extends the use of the buffer to ultra-high-speed and low-amplitude periodic signals by removing the feedback resistor and increasing the gain of an inverter stage. A replica biasing stage is provided to level shift the input signal's DC offset to mid-rail and track process variations of the inverter stage's threshold voltage. In addition, the replica biasing stage may achieve more accurate duty cycle when buffering ultra-high-speed periodic signals compared to conventional buffers.

The various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

For example, means for transmitting may comprise a transmitter (e.g., the transceiver front end 254 of the user terminal 120 depicted in FIG. 2, the transceiver front end 222 of the access point 110 shown in FIG. 2, or the transceiver front end 300 illustrated in FIG. 3) and/or an antenna (e.g., the antennas 252ma through 252mu of the user terminal 120m portrayed in FIG. 2, the antennas 224a through 224ap of the access point 110 illustrated in FIG. 2, or the antenna 303 of the transceiver front end 300 depicted in FIG. 3). Means for receiving may comprise a receiver (e.g., the transceiver front end 254 of the user terminal 120 depicted in FIG. 2, the transceiver front end 222 of the access point 110 shown in FIG. 2, or the transceiver front end 300 illustrated in FIG. 3) and/or an antenna (e.g., the antennas 252ma through 252mu of the user terminal 120m portrayed in FIG. 2, the antennas 224a through 224ap of the access point 110 illustrated in FIG. 2, or the antenna 303 of the transceiver front end 300 depicted in FIG. 3). Means for processing or means for determining may comprise a processing system, which may include one or more processors (e.g., the TX data processor 210, the RX data processor 242, and/or the controller 230 of the access point 110 shown in FIG. 2, or the RX data processor 270, the TX data processor 288, and/or the controller 280 of the user terminal 120 illustrated in FIG. 2). Means for inverting may comprise an inverter (stage), such as the inverter stages 604, 606 illustrated in FIG. 6. Means for shifting an offset voltage may comprise level-shifting circuitry, such as the biasing stage 602 illustrated in FIG. 6. Means for generating an output signal may comprise any of various suitable circuit components, such as a cross-coupled transistor stage 626 and/or an inverter (stage) as illustrated in FIG. 6.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general-purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC (Application Specific Integrated Circuit) with the processor, the bus interface, the user interface in the case of an access terminal), supporting circuitry, and at least a portion of the machine-readable media integrated into a single chip, or with one or more FPGAs (Field Programmable Gate Arrays), PLDs (Programmable Logic Devices), controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A buffer for a voltage-controlled oscillator (VCO), comprising:
   a first inverter stage having an input node configured to receive a first complementary signal of a differential pair;
   a second inverter stage having an input node configured to receive a second complementary signal of the differential pair;
   a biasing stage replicating the first inverter stage or the second inverter stage, wherein an output node of the biasing stage is connected with an input node of the biasing stage;

a first impedance coupled between the input node of the first inverter stage and the input node of the biasing stage; and a second impedance coupled between the input node of the second inverter stage and the input node of the biasing stage.

2. The buffer of claim 1, further comprising:
a cross-coupled transistor stage coupled to the first inverter stage and the second inverter stage and configured to generate an output signal of the buffer.

3. The buffer of claim 2, further comprising:
a third inverter stage coupled between the first inverter stage and the cross-coupled transistor stage; and
a fourth inverter stage coupled between the second inverter stage and the cross-coupled transistor stage.

4. The buffer of claim 1, further comprising:
a first capacitive element coupled to the input node of the first inverter stage; and
a second capacitive element coupled to the input node of the second inverter stage such that the differential pair is an AC-coupled differential signal.

5. The buffer of claim 1, wherein:
a first resistive element is lacking between the input node of the first inverter stage and an output node of the first inverter stage; and
a second resistive element is lacking between the input node of the second inverter stage and an output node of the second inverter stage.

6. The buffer of claim 1, wherein the differential pair oscillates with a frequency of at least 8 GHz.

7. The buffer of claim 1, wherein:
the biasing stage is configured to shift a DC offset of the differential pair to a level midway between two power supply rails for the buffer; and
the two power supply rails are configured to power the first and second inverter stages.

8. The buffer of claim 1, wherein a duty cycle of a periodic signal at an output of the buffer is between 45% and 55% when the differential pair oscillates with a frequency of 10 GHz across process, voltage, and temperature variations.

9. The buffer of claim 1, wherein P-type metal-oxide-semiconductor (PMOS) and N-type metal-oxide-semiconductor (NMOS) transistors of the biasing stage have the same sizes as PMOS and NMOS transistors of the first inverter stage or the second inverter stage.

10. The buffer of claim 1, wherein a voltage at the output node of the biasing stage is configured to track at least one of temperature drift or one or more process variations of a threshold voltage for transistors in the first inverter stage or the second inverter stage.

11. The buffer of claim 1, wherein:
the biasing stage comprises a P-type metal-oxide-semiconductor (PMOS) transistor and an N-type metal-oxide-semiconductor (NMOS) transistor;
a drain of the PMOS transistor is connected with a drain of the NMOS transistor to form the output node of the biasing stage;
a gate of the PMOS transistor is connected with a gate of the NMOS transistor to form the input node of the biasing stage; and
the input and output nodes of the biasing stage are shorted together.

12. The buffer of claim 1, wherein the first and second impedances comprise two resistive elements having equal resistance.

13. The buffer of claim 1, wherein the first inverter stage has the same components and topology as the second inverter stage.

14. A method of buffering differential signals using a buffer, comprising:
receiving a first complementary signal of a differential pair via an input node of a first inverter stage of the buffer;
receiving a second complementary signal of the differential pair via an input node of a second inverter stage of the buffer;
shifting an offset voltage of the differential pair using a biasing stage replicating the first inverter stage or the second inverter stage, wherein an output node of the biasing stage is connected with an input node of the biasing stage; and
generating an output signal of the buffer based on the differential pair and the shifted offset voltage.

15. The method of claim 14, further comprising:
receiving power at the first inverter stage and the second inverter stage via two power supply rails for the buffer, wherein the shifting comprises shifting the offset voltage of the differential pair to a level midway between the two power supply rails.

16. The method of claim 14, wherein generating the output signal comprises using a cross-coupled transistor stage coupled to the first inverter stage and to the second inverter stage to generate the output signal.

17. The method of claim 16, wherein the buffer further comprises:
a third inverter stage coupled between the first inverter stage and the cross-coupled transistor stage; and
a fourth inverter stage coupled between the second inverter stage and the cross-coupled transistor stage.

18. The method of claim 14, wherein the differential pair is an AC-coupled differential signal and wherein the buffer further comprises:
a first capacitive element coupled to the input node of the first inverter stage; and
a second capacitive element coupled to the input node of the second inverter stage.

19. The method of claim 14, wherein the buffer is lacking:
a first resistive element coupled between the input node of the first inverter stage and an output node of the first inverter stage; and
a second resistive element coupled between the input node of the second inverter stage and an output node of the second inverter stage.

20. The method of claim 14, wherein the biasing stage comprises P-type metal-oxide-semiconductor (PMOS) and N-type metal-oxide-semiconductor (NMOS) transistors having the same sizes as PMOS and NMOS transistors of the first inverter stage or the second inverter stage.

21. The method of claim 14, wherein:
the biasing stage comprises a P-type metal-oxide-semiconductor (PMOS) transistor and an N-type metal-oxide-semiconductor (NMOS) transistor;
a drain of the PMOS transistor is connected with a drain of the NMOS transistor to form the output node of the biasing stage;
a gate of the PMOS transistor is connected with a gate of the NMOS transistor to form the input node of the biasing stage; and
the input and output nodes of the biasing stage are shorted together.

22. The method of claim 14, wherein the first inverter stage has the same components and topology as the second inverter stage.

23. The method of claim 14, wherein a voltage at the output node of the biasing stage is configured to track at least one of temperature drift or one or more process variations of a threshold voltage for transistors in the first inverter stage or the second inverter stage.

24. The method of claim 14, wherein the buffer further comprises:
    a first impedance coupled between the input node of the first inverter stage and the input node of the biasing stage; and
    a second impedance coupled between the input node of the second inverter stage and the input node of the biasing stage.

25. The method of claim 24, wherein the first and second impedances comprise two resistive elements having equal resistance.

26. The method of claim 14, wherein the differential pair oscillates with a frequency of at least 8 GHz.

27. The method of claim 14, wherein a duty cycle of the output signal of the buffer is between 45% and 55% when the differential pair oscillates with a frequency of 10 GHz across process, voltage, and temperature variations.

28. An apparatus for buffering differential signals, comprising:
    means for inverting a first complementary signal of a differential pair;
    means for inverting a second complementary signal of the differential pair;
    means for shifting an offset voltage of the differential pair using a biasing stage replicating the means for inverting the first complementary signal or the means for inverting the second complementary signal, wherein an output node of the biasing stage is connected with an input node of the biasing stage; and
    means for generating an output signal of the apparatus based on the differential pair and the shifted offset voltage.

* * * * *